(12) United States Patent
Bunce et al.

(10) Patent No.: US 8,345,490 B2
(45) Date of Patent: Jan. 1, 2013

(54) SPLIT VOLTAGE LEVEL RESTORE AND EVALUATE CLOCK SIGNALS FOR MEMORY ADDRESS DECODING

(75) Inventors: Paul A. Bunce, Poughkeepsie, NY (US); John D. Davis, Maybrook, NY (US); Diana M. Henderson, Poughkeepsie, NY (US); Jigar J. Vora, Westborough, MA (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 12/821,824

(22) Filed: Jun. 23, 2010

(65) Prior Publication Data

US 2011/0317499 A1 Dec. 29, 2011

(51) Int. Cl.
*G11C 7/00* (2006.01)
(52) U.S. Cl. ............................... 365/189.11; 365/233.5
(58) Field of Classification Search ............. 365/189.11, 365/233.5
See application file for complete search history.

(56) References Cited

U.S. PATENT DOCUMENTS

| | | |
|---|---|---|
| 4,998,221 A | 3/1991 | Correale, Jr. |
| 5,146,427 A | 9/1992 | Sasaki et al. |
| 5,376,849 A | 12/1994 | Dickol et al. |
| 5,450,357 A | 9/1995 | Coffman |
| 5,612,916 A | 3/1997 | Neduva |
| 5,623,217 A | 4/1997 | Britton et al. |
| 5,726,677 A * | 3/1998 | Imamura .................. 345/99 |
| 5,818,409 A * | 10/1998 | Furuhashi et al. ......... 345/94 |
| 5,952,859 A | 9/1999 | Kim et al. |
| 6,061,296 A | 5/2000 | Ternullo, Jr. et al. |
| 6,084,454 A | 7/2000 | Holst |
| 6,356,473 B1 | 3/2002 | Shimoyama |
| 6,377,098 B1 | 4/2002 | Rebeor |
| 6,384,754 B1 * | 5/2002 | Park .......................... 341/120 |
| 6,510,089 B2 | 1/2003 | Taura et al. |
| 7,042,262 B2 | 5/2006 | Tam et al. |
| 7,075,855 B1 | 7/2006 | Bunce et al. |
| 7,233,542 B2 | 6/2007 | Bunce et al. |
| 7,246,279 B2 | 7/2007 | Pendurkar |
| 7,363,526 B1 | 4/2008 | Chong et al. |
| 7,425,855 B2 | 9/2008 | Chen et al. |

(Continued)

FOREIGN PATENT DOCUMENTS

KR 100298181 B1 5/2001

(Continued)

OTHER PUBLICATIONS

IBM; "Level Shifter Incorporated into Address Pre-decode Circuit for SRAMs Employing 2 Voltage Planes;" IP.COM Technical Disclosure; Jan. 6, 2009.

(Continued)

*Primary Examiner* — Michael Tran
(74) *Attorney, Agent, or Firm* — Cantor Colburn LLP; William A. Kinnaman, Jr.

(57) ABSTRACT

A method of implementing voltage level shifting for a memory device includes coupling one or more evaluation clock signals to a memory address decode circuit, the one or more evaluation clock signals operating at a first voltage supply level; and coupling a restore clock signal to the memory address decode circuit, the restore clock signal operating at a second voltage supply level that is higher than the first voltage supply level; wherein one or more outputs of the memory address decode circuit operate at the second voltage supply level.

12 Claims, 3 Drawing Sheets

U.S. PATENT DOCUMENTS

| | | | |
|---|---|---|---|
| 7,443,223 | B2 | 10/2008 | Bajkowski et al. |
| 7,463,545 | B2 | 12/2008 | Kumala |
| 7,515,482 | B2 | 4/2009 | Kim et al. |
| 7,535,776 | B1 | 5/2009 | Behrends et al. |
| 7,596,053 | B1 | 9/2009 | White et al. |
| 7,668,037 | B2 | 2/2010 | Carpenter et al. |
| 7,710,796 | B2 | 5/2010 | Cottier et al. |
| 2007/0002619 | A1 | 1/2007 | Schoenauer et al. |
| 2008/0029839 | A1 | 2/2008 | Hold et al. |
| 2008/0258790 | A1 | 10/2008 | Branch et al. |
| 2009/0059653 | A1 | 3/2009 | Luk et al. |
| 2009/0109766 | A1 * | 4/2009 | Terzioglu et al. ........ 365/189.15 |
| 2010/0039872 | A1 | 2/2010 | Park et al. |
| 2011/0317496 | A1 | 12/2011 | Bunce et al. |
| 2011/0317505 | A1 | 12/2011 | Bunce et al. |
| 2011/0320851 | A1 | 12/2011 | Bunce et al. |

FOREIGN PATENT DOCUMENTS

WO   0156084 A1   8/2001

OTHER PUBLICATIONS

Disclosed Anonymously; "A Clocked Single Supply Level Shifter with Buit-In Firewall;" IP.COM Technical Disclosure; Feb. 3, 2009.
J. Davis et al.; "A .6GHZ 64KB Dual-Read Data Cache for the Power6 Processor," IEEE International Solid-State Circuits Conference; 2006; pp. 1-2.
U.S. Appl. No. 12/822,058; Non-Final Office Action; Date Filed: Jun. 23, 2010; Date Mailed: May 11, 2012; pp. 1-11.
U.S. Appl. No. 12/822,038; Non-Final Office Action; Date Filed Jun. 23, 2010; Date Mailed: May 15, 2012; pp. 1-11.
IBM and Ristard; "Programmable Pulse Generator," IP.COM Technical Disclosure; May 1, 1975, pp. 1-3.

\* cited by examiner

SPLIT VOLTAGE LEVEL RESTORE AND EVALUATE CLOCK SIGNALS FOR MEMORY ADDRESS DECODING

BACKGROUND

The present invention relates generally to integrated circuit memory devices and, more particularly, to a method and system for using split voltage level restore and evaluate clock signals for memory address decoding.

As integrated memory circuits are scaled down it becomes desirable to reduce the power supply voltage. However, the individual memory cells (e.g., static random access memory or SRAM cells) are very sensitive to reductions in the applied voltage. As the supply voltage is reduced, there is an increase in memory write and read errors due to, for example, ambiguities in the value of a charge stored by the memory cell (e.g., soft errors). To reduce power consumption and enable further reduction in circuit size, one approach is to provide a reduced voltage level supply to circuits other than the memory cell array (e.g., decoders, clock circuits, etc.) while maintaining the voltage supplied to the memory cells at some desirable level. Even though the memory cells continue to be operated at the higher voltage and power levels, the net effect is to substantially reduce power consumption. Although the support circuits are continually operating, only a small number of the memory cells (e.g., only those actually being accessed) are fully powered at any particular time.

Implementing a sufficiently high voltage within a memory cell array while using a reduced voltage for other memory structures and interfacing devices may be accomplished by the use of level shifters to interface the components. For example, a "high" voltage supply with a low logic level of 0 volts (V) and a high logic level of 1.3 V may be used within a memory cell array while a high logic level of only 0.7 V may be used outside the array for other memory structures (e.g., support circuitry associated with the memory cell array such as address decoders and timing circuits) and interfacing devices (e.g., address and data busses). A transition from the lower voltage logic level to the higher voltage logic levels may be accomplished using such level shifters. While reducing power requirements, incorporating these level shifters consumes additional energy to power the level shifters and requires additional area or space on a chip. The level shifters may also introduce a delay in signal propagation time, skewing clock, control and data signals. Thus, the number and configuration of level shifters can affect memory size, timing and power requirements.

Accordingly, one challenge in designing dual voltage supply memory arrays is the consideration of how and when to transition from the low voltage supply, primarily used for powering peripheral circuits, to the high voltage supply that powers the memory cells. The point in the design chosen for such level shifting may have area implications; for example, the level shift may occur in a circuit stage that has repeated instances. Alternatively, there may be a latency impact if a level shift stage is introduced in a critical path solely for the purpose of translating the signal to the higher voltage supply.

In addition, there are also voltage differential (Vdiff) considerations for knowing how circuits powered by different supplies will behave as the supply steers away from nominal operating conditions. One conventional approach in this regard for memory applications is to delay introduction of the higher voltage to the final word decode stage. This has two disadvantages: first, this technique requires that each word decoder be an explicit level shifter, which increases the area. Second, while a simple "brute force" level shifter may be used to minimize area, such a level shift circuit does not support large Vdiff requirements. Still another alternative may be to level shift each input to the decoder. However, this approach would add stages of delay in the access path, which would in turn increase the setup time.

SUMMARY

In an exemplary embodiment, a method of implementing voltage level shifting for a memory device includes coupling one or more evaluation clock signals to a memory address decode circuit, the one or more evaluation clock signals operating at a first voltage supply level; and coupling a restore clock signal to the memory address decode circuit, the restore clock signal operating at a second voltage supply level higher than the first voltage supply level; wherein one or more outputs of the memory address decode circuit operate at the second voltage supply level.

In another embodiment, a system for implementing voltage level shifting for a memory device includes a memory address decode circuit having one or more evaluation clock signals as inputs coupled thereto, the one or more evaluation clock signals configured to operate at a first voltage supply level; and the memory address decode circuit having a restore clock signal as another input coupled thereto, the restore clock signal configured to operate at a second voltage supply level higher than the first voltage supply level; wherein one or more outputs of the memory address decode circuit operate at the second voltage supply level.

In another embodiment, a memory address decode circuit includes one or more pull up devices coupled to one or more dynamic evaluation nodes, with one or more outputs of the address decode circuit comprising inverted values of the dynamic evaluation nodes; and a plurality of pull down stacks coupled to the one or more dynamic evaluation nodes, the plurality of pull down stacks comprising serially connected pull down devices; wherein the serially connected pull down devices are controlled by static read and write address bits and by read and write clock evaluation signals all operating at a first voltage supply level; and wherein the one or more pull up devices are controlled by a restore clock signal, the restore clock signal operating at a second voltage supply level higher than the first voltage supply level, with one or more outputs of the address decode circuit operating at the second voltage supply level.

BRIEF DESCRIPTION OF THE SEVERAL VIEWS OF THE DRAWINGS

Referring to the exemplary drawings wherein like elements are numbered alike.

DETAILED DESCRIPTION

Disclosed herein is a method and system for implementing a voltage power supply level shift in an existing stage of a critical signal path that will in turn require neither extensive growth of the overall macro nor additional stages of delay in the timing access path. Briefly stated, the embodiments herein provide split voltage levels with respect to restore and evaluation clocks in the address decode scheme of an SRAM memory architecture.

More specifically, a higher voltage clock adds a level shift function to an address decoder, which utilizes two separate clock signal types: one for a restore operation and another for evaluation. Whereas the restore clock is powered by the high voltage supply, the evaluation clocks are powered by the low voltage supply. As described in further detail below, the level shift function is incorporated in the existing decode circuitry by introducing a higher voltage restore clock signal, so there is minimal area impact. Using the higher supply on circuits in the critical path gives better overall performance in the array, with little increase in overall active power. The early introduction of the higher voltage level into the address decode path also provides some voltage commonality between the circuits generating the read and write timing windows and the memory cell read and write current.

In addition, the split clock method described herein allows for additional tuning of the decoder's active pulse. For instance, the output pulse width could be widened by widening the reset high pulse and leaving the evaluate clock as is, or by making it narrower. In addition the restore clock edges and pulse width can be designed to vary as a function of the higher voltage while the evaluate clock edges and pulse width can be designed to vary as a function of the lower voltage. Thus the timing requirements of the address inputs would only vary according to the lower voltage supply while the output pulse width can vary as a function of the higher supply.

Figure 1:
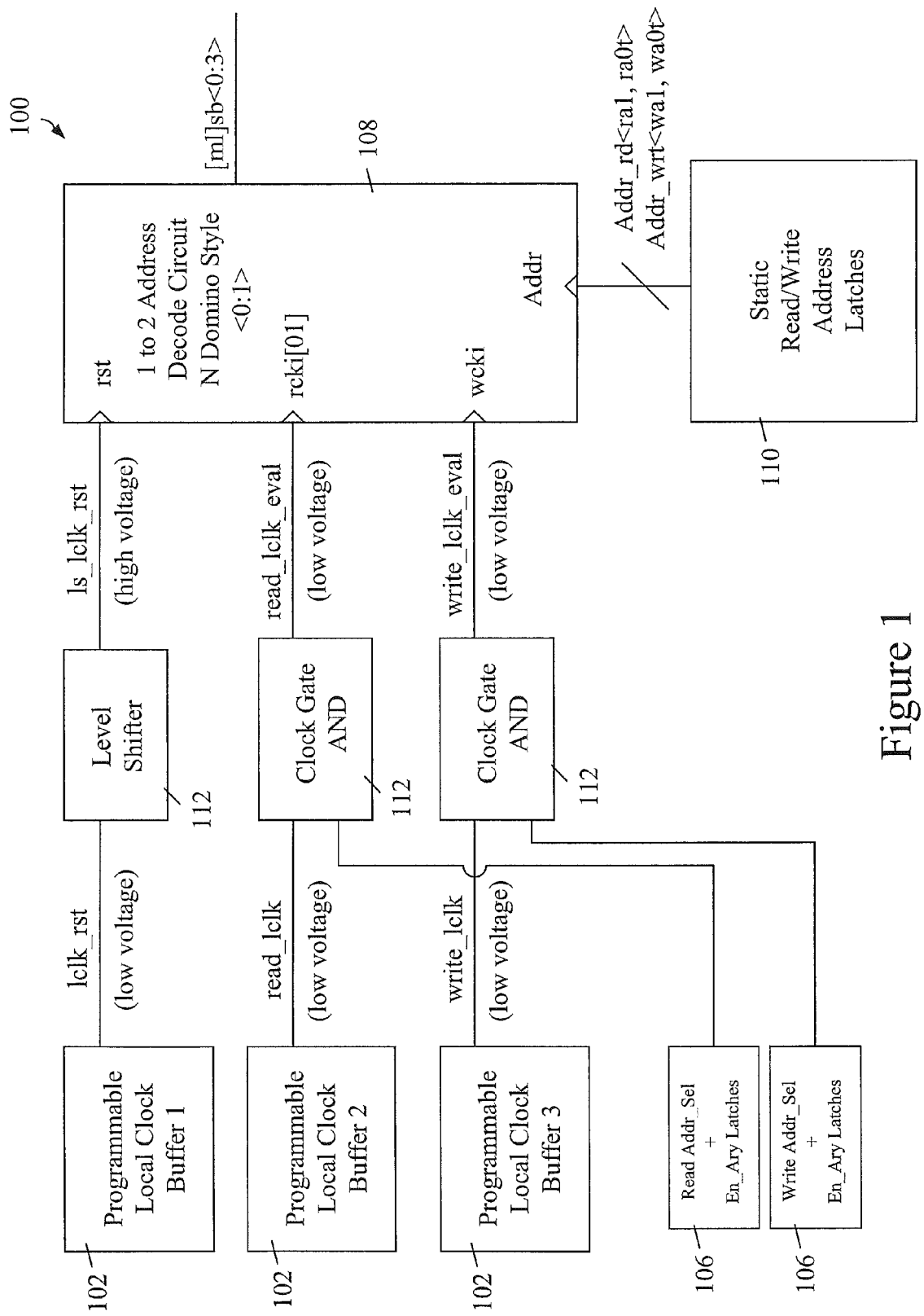
FIG. 1 is a schematic block diagram of a system for using split voltage level restore and evaluate clock signals for memory address decoding, in accordance with an embodiment of the invention.

Referring initially to FIG. 1, there is shown a schematic diagram of a system 100 for using split voltage level restore and evaluate clock signals for memory address decoding, in accordance with an embodiment of the invention. In the embodiment illustrated, two evaluation clock signals (read and write), and a single restore clock signal are generated. As shown in FIG. 1, a plurality of programmable local clock buffers 102 (Buffer 1, Buffer 2, Buffer 3) are provided to generate, respectively, a low voltage local clock reset signal (lclk_rst), a low voltage read local clock signal (read_lclk), and a low voltage write local clock signal (write_lclk).

The pulsed read and write local clock signals are AND gated, by clock gates 104, with static read/write address select and enable bits stored in respective latches 106. The outputs of the clock gates 104 comprise low voltage, read and write local clock evaluation signals (read_lclk_eval and write_lclk_eval) that drive a domino address decode circuit 108. The read and write local clock evaluation signals, which are further designated as rcki[01] and wcki within the address decode circuit 108, and described in more detail below, serve to clock static read and write addresses from input latches 110.

In contrast to the pulsed read and write local clock signals (which remain at the lower operating voltage), the pulsed restore clock signal (lclk_rst) is fed through a dynamic level shifter 112 rather than a clock gate, translating it to a higher voltage local restore clock signal (ls_lclk_rst) with similar timing characteristics as the read_lck_eval and the write_lclk_eval signals. The higher voltage level is the same voltage level used to power the memory cells and bit circuitry. The resulting ls_lclk_rst signal is fed to the address decode circuit 108, serving as its restore clock. The arrival times and pulse widths of the restore and read/write evaluation clocks control the launching of the addresses through the decode circuit 108.

Figure 2:
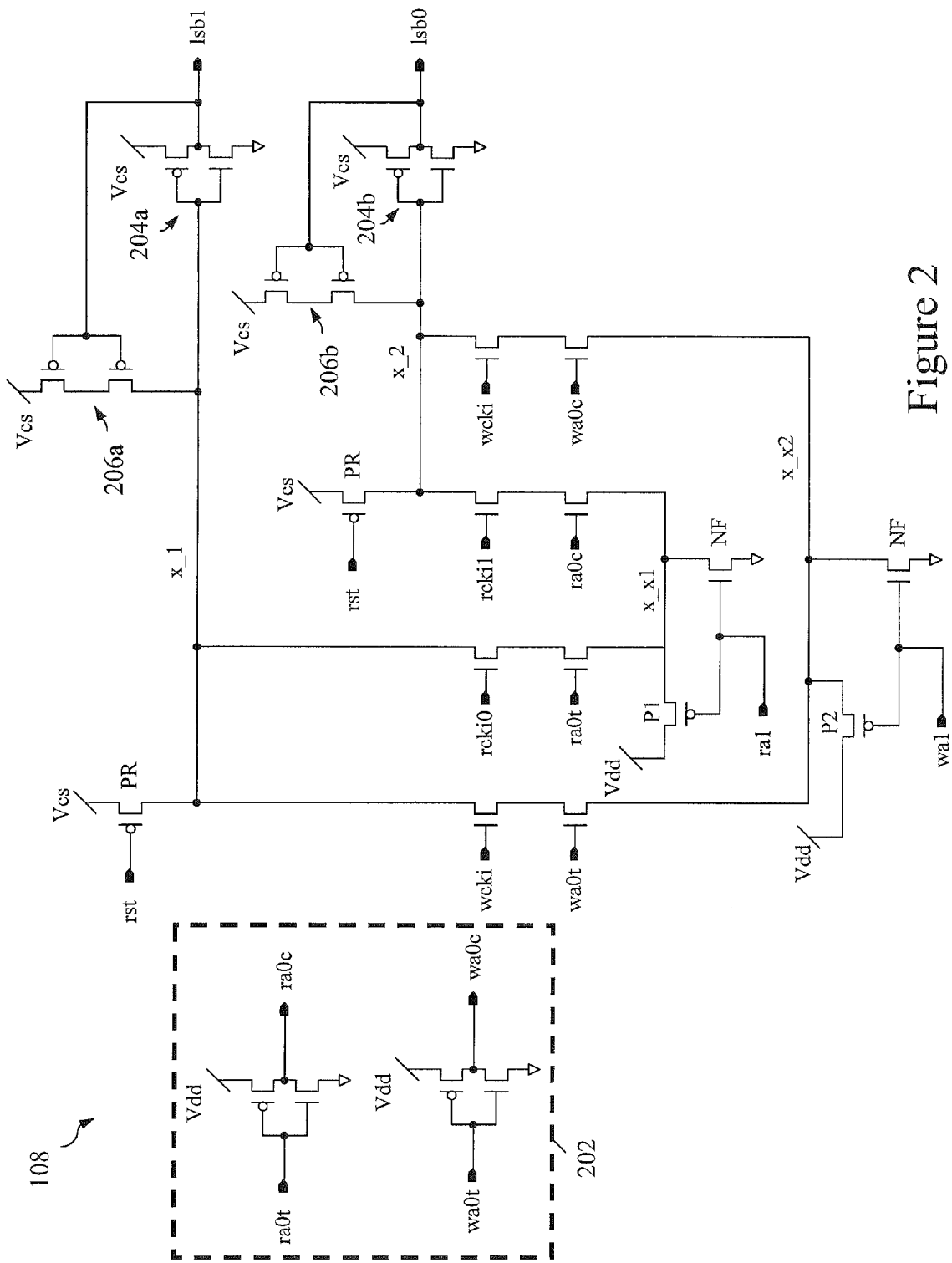
FIG. 2 is a schematic diagram illustrating the address decode circuit of FIG. 1 in further detail.

Referring now to FIG. 2, there is shown a schematic diagram illustrating the address decode circuit 108 of FIG. 1 in further detail. The address decode circuit 108, used for multiplexing and decoding of read and write addresses, is depicted as an N-domino topology, pre-decode circuit where two instances of the circuit 108 perform a 2-to-4 address decode function. As particularly shown in FIG. 2, the address decode circuit 108 receives as clock signal inputs thereto, the reset (rst), write (wcki), and read (rcki) clocks from the programmable local clock buffers 102 of FIG. 1 after passing through the level shifter (112) and clock gates (104) also of FIG. 1. In addition, the address decode circuit 108 receives as static data inputs thereto, read (ra1, ra0$t$) and write (wa1, wa0$t$) addresses, which are driven by latches 110 as also shown in FIG. 1.

As indicated previously, the input reset clock signal (rst) operates at the high voltage supply, designated as Vcs in FIG. 2. All other inputs to the address decode circuit 108 (i.e., ra0$t$, wa0$t$, ra1, wa1, wclk, and rcki) operate at the low voltage supply, designated as Vdd in FIG. 2. For decoding purposes, wa0$t$ and ra0$t$ are inverted internally within the circuit 108, as shown in the dashed insert 202, to generate complementary signals wa0c and ra0c. For each output (lsb0/lsb1) shown in FIG. 2, the address decode circuit 108 muxes the read and write addresses, with the selection based on the read/write clocks signals, and then decodes the selected read or write addresses. Although the address decode circuit embodiment of FIG. 2 is used for a dual read port design, it will be appreciated that the present split clock method may be implemented with many variations of, for example, an NFET (n-type field effect transistor) pull down network in the decode circuit.

Figure 3:
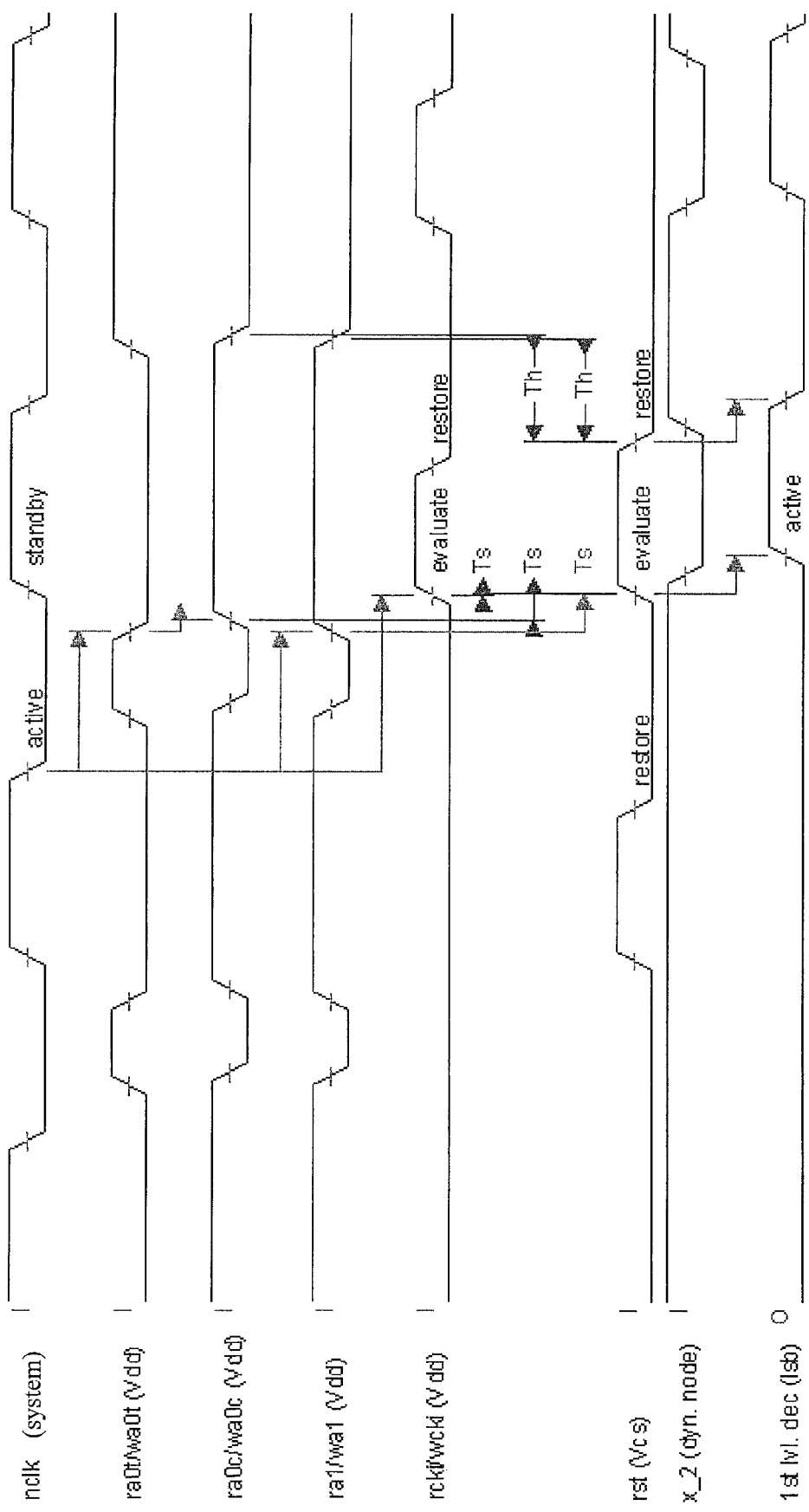
FIG. 3 is a waveform diagram illustrating the signal timing relationships of the address decode circuit of FIGS. 1 and 2.

Referring now to both FIG. 2 and the waveform diagram of FIG. 3, the operation and timing relationships of the signals in the address decode circuit 108 will be understood.

During a restore, the rst clock signal, operating at Vcs, is active low, which pulls internal dynamic nodes x_1 and x_2 in FIG. 2 high by restore PFETs PR, thus restoring the outputs lsb1 and lsb0 low via the inverters 204a, 204b. Also included within the address decode circuit of FIG. 2 are PFET half latch keepers 206a, 206b for initially maintaining the precharged state of internal dynamic nodes x_1 and x_2 (once the reset clock signal goes inactive high,) and holding the precharged state (if none of the NFET stacks are activated.) The static read/write address bits (ra0$t$/wa0$t$/ra1/wa1) are set up prior to the rising rcki and/or wcki signals. When rcki and/or wcki and rst go high, the restore PFETs PR are shut off and one of the NFET pull down stacks is evaluated (assuming that the static read/write address bits of the NFET pull down stack are set up active high). As a result, the active NFET stack pulls one of the dynamic nodes (x_1 or x_2) low, forcing the output (lsb0/lsb1) to switch high. This evaluation window is set from the time an NFET stack pulls down to when the rcki and/or wcki clocks return to 0. The restore PFETs PR turn back on by virtue of rst going low, thus determining the pulse width of the lsb0 and lsb1 outputs.

As further depicted in FIG. 2, the address decode circuit 108 also includes NFET footers NF coupled to internal nodes x_x1 and x_x2, and driven by read and write address data bits ra1 and wa1. Gated PFETs P1 and P2 are provided to reduce charge sharing from the dynamic nodes (x_1 and x_2) to the intermediate nodes of the pull down stacks. These charge sharing PFETs may be supplied by the low voltage Vdd, since the low voltage is used to gate all of the devices in the pull down stacks.

It should be appreciated that the pull down structure described in connection with FIG. 2 represents only an exemplary embodiment of a structure that may be used for decoding and introducing the higher voltage. That is, a domino circuit that multiplexes read/write addresses is not the only topology that may take advantage of the voltage level shifting as described herein.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of implementing voltage level shifting for a memory device, the method comprising:
   coupling one or more evaluation clock signals to a memory address decode circuit, the one or more evaluation clock signals operating at a first voltage supply level;
   coupling static read and write address bits to the memory address decode circuit, the static read and write address bits operating at the first voltage supply level; and
   coupling a restore clock signal to the memory address decode circuit, the restore clock signal operating at a second voltage supply level higher than the first voltage supply level;
   wherein one or more outputs of the memory address decode circuit operate at the second voltage supply level; and
   wherein the one or more evaluation clock signals comprise read and write evaluation clock signals.

2. The method of claim 1, further comprising generating the restore clock signal by coupling an output of a first programmable local clock buffer operating at the first voltage level to a level shifter, the level shifter outputting the restore clock signal operating at the second voltage supply level.

3. The method of claim 2, further comprising generating the read and write evaluation clock signals by gating outputs of second and third programmable local clock buffers, respectively, with static read and write address select and enable signals.

4. The method of claim 1, wherein the restore clock signal controls one or more pull up devices coupled to one or more dynamic evaluation nodes within the memory address decode circuit, the one or more dynamic evaluation nodes precharged to the second voltage supply level.

5. The method of claim 4, wherein the read and write evaluation clock signals and static read and write address bits control individual pull down devices included in pull down stacks coupled to the one or more dynamic evaluation nodes.

6. A system for implementing voltage level shifting for a memory device, comprising:
   a memory address decode circuit configured to receive one or more evaluation clock signals as inputs coupled thereto, the one or more evaluation clock signals configured to operate at a first voltage supply level;
   static read and write address bits coupled to the memory address decode circuit, the static read and write address bits configured to operate at the first voltage supply level and
   the memory address decode circuit further configured to receive a restore clock signal an another input coupled thereto, the restore clock signal configured to operate at a second voltage supply level higher than the first voltage supply level;
   wherein one or more outputs of the memory address decode circuit operate at the second voltage supply level; and
   wherein the one or more evaluation clock signals comprise read and write evaluation clock signals.

7. The system of claim 6, further comprising an output of a first programmable local clock buffer configured to operate at the first voltage level coupled to a level shifter, wherein the level shifter outputs the restore clock signal at the second voltage supply level.

8. The system of claim 7, wherein the read and write evaluation clock signals are generated by gating outputs of second and third programmable local clock buffers, respectively, with static read and write address select and enable signals.

9. The system of claim 6, wherein the restore clock signal controls one or more pull up devices coupled to one or more dynamic evaluation nodes within the memory address decode circuit, the one or more dynamic evaluation nodes precharged to the second voltage supply level.

10. The system of claim 9, wherein the read and write evaluation clock signals and static read and write address bits control individual pull down devices included in pull down stacks coupled to the one or more dynamic evaluation nodes.

11. A memory address decode circuit, comprising:
   one or more pull up devices coupled to one or more dynamic evaluation nodes, with one or more outputs of the address decode circuit comprising inverted values of the dynamic evaluation nodes; and
   a plurality of pull down stacks coupled to the one or more dynamic evaluation nodes, the plurality of pull down stacks comprising serially connected pull down devices;
   wherein the serially connected pull down devices are controlled by static read and write address bits and by read and write clock evaluation signals all operating at a first voltage supply level; and
   wherein the one or more pull up devices are controlled by a restore clock signal, the restore clock signal operating at a second voltage supply level higher than the first voltage supply level, with one or more outputs of the address decode circuit operating at the second voltage supply level.

12. The memory address decode circuit of claim 11, further comprising gated pull up devices configured to prevent charge sharing on intermediate nodes of the pull down stacks, the gated pull up devices operating at the first voltage supply level and coupled to one or more of the static read and write address bits.

* * * * *